(12) United States Patent
Yamamoto et al.

(10) Patent No.: US 10,411,172 B2
(45) Date of Patent: Sep. 10, 2019

(54) LIGHT SOURCE CIRCUIT UNIT, ILLUMINATOR, AND DISPLAY

(71) Applicant: Saturn Licensing LLC, New York, NY (US)

(72) Inventors: Koichi Yamamoto, Kanagawa (JP); Takehito Hirose, Aichi (JP); Shigeru Teshigahara, Gifu (JP)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 16/027,678

(22) Filed: Jul. 5, 2018

(65) Prior Publication Data

US 2018/0315905 A1 Nov. 1, 2018

Related U.S. Application Data

(63) Continuation of application No. 15/679,904, filed on Aug. 17, 2017, now Pat. No. 10,056,532, which is a
(Continued)

(30) Foreign Application Priority Data

Jun. 17, 2011 (JP) .................. 2011-135656

(51) Int. Cl.
*H01L 33/54* (2010.01)
*H01L 33/60* (2010.01)
(Continued)

(52) U.S. Cl.
CPC .............. *H01L 33/54* (2013.01); *F21V 11/00* (2013.01); *G02B 6/0073* (2013.01);
(Continued)

(58) Field of Classification Search
CPC ....... H01L 33/54; H01L 33/486; H01L 33/60; H01L 33/62; F21V 11/00
See application file for complete search history.

(56) References Cited

U.S. PATENT DOCUMENTS 6,426,021 B2 7/2002 Suga et al.
6,489,637 B1 12/2002 Sakamoto et al.
(Continued)

FOREIGN PATENT DOCUMENTS

CN 2641836 Y 9/2004
EP 2014735 A2 1/2009
(Continued)

OTHER PUBLICATIONS

Partial European Search Report for EP Application No. 128009123, dated Nov. 11, 2014.
(Continued)

*Primary Examiner* — Anne M Hines
(74) *Attorney, Agent, or Firm* — Lerner, David, Littenberg, Krumholz & Mentlik, LLP

(57) ABSTRACT

Provided are a light source circuit unit that improves light extraction efficiency, as well as an illuminator and a display that include such a light source circuit unit. The light source circuit unit includes: a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

20 Claims, 8 Drawing Sheets

Related U.S. Application Data continuation of application No. 15/208,214, filed on Jul. 12, 2016, now Pat. No. 9,773,957, which is a continuation of application No. 14/713,628, filed on May 15, 2015, now Pat. No. 9,412,919, which is a continuation of application No. 14/125,161, filed as application No. PCT/JP2012/063748 on May 29, 2012, now Pat. No. 9,059,382.

(51) Int. Cl.

| | | |
|---|---|---|
| *H01L 33/62* | (2010.01) | |
| *F21V 11/00* | (2015.01) | |
| *F21V 8/00* | (2006.01) | |
| *H01L 25/075* | (2006.01) | |
| *H01L 33/48* | (2010.01) | |
| *G02F 1/1335* | (2006.01) | |
| *F21W 131/103* | (2006.01) | |
| *F21W 131/205* | (2006.01) | |
| *F21Y 101/00* | (2016.01) | |
| *F21Y 115/10* | (2016.01) | |

(52) U.S. Cl.
CPC ........ *H01L 25/0753* (2013.01); *H01L 33/486* (2013.01); *H01L 33/60* (2013.01); *H01L 33/62* (2013.01); *F21W 2131/103* (2013.01); *F21W 2131/205* (2013.01); *F21Y 2101/00* (2013.01); *F21Y 2115/10* (2016.08); *G02B 6/0031* (2013.01); *G02B 6/0083* (2013.01); *G02F 1/133603* (2013.01); *H01L 2224/48091* (2013.01); *H01L 2224/48464* (2013.01); *H01L 2224/49107* (2013.01); *H01L 2224/73265* (2013.01); *H01L 2924/181* (2013.01); *H01L 2933/005* (2013.01); *H01L 2933/0058* (2013.01)

(56) References Cited

U.S. PATENT DOCUMENTS

| | | | |
|---|---|---|---|
| 7,728,343 | B2 | 6/2010 | Fujino et al. |
| 7,898,614 | B2 | 3/2011 | Mishima et al. |
| 7,959,321 | B2 | 6/2011 | Ryu et al. |
| 8,132,952 | B2 | 3/2012 | Ryu et al. |
| 8,208,093 | B2 | 6/2012 | Shinozaki et al. |
| 8,300,177 | B2 | 10/2012 | Takemoto et al. |
| 8,575,646 | B1* | 11/2013 | Shum ............... H01L 33/54 257/100 |
| 8,829,776 | B2 | 9/2014 | Yamamoto et al. |
| 8,876,356 | B2 | 11/2014 | Yamamoto |
| 9,059,382 | B2 | 6/2015 | Yamamoto et al. |
| 9,412,919 | B2 | 8/2016 | Yamamoto et al. |
| 2005/0122031 | A1 | 6/2005 | Itai et al. |
| 2006/0279962 | A1 | 12/2006 | Loh |
| 2007/0096129 | A1 | 5/2007 | Park |
| 2007/0228386 | A1 | 10/2007 | Shie et al. |
| 2008/0007939 | A1 | 1/2008 | Lee et al. |
| 2009/0109688 | A1 | 4/2009 | Hsu et al. |
| 2009/0115711 | A1 | 5/2009 | Ueyama |
| 2009/0315057 | A1 | 12/2009 | Konishi et al. |
| 2010/0207154 | A1 | 8/2010 | Song et al. |
| 2010/0245703 | A1 | 9/2010 | Lin |
| 2010/0245720 | A1 | 9/2010 | Moriya et al. |
| 2011/0249424 | A1 | 10/2011 | Joo et al. |
| 2011/0291152 | A1* | 12/2011 | Liaw ............... H01L 33/62 257/99 |

FOREIGN PATENT DOCUMENTS

| | | |
|---|---|---|
| JP | 10144963 A | 5/1998 |
| JP | H10294498 A | 11/1998 |
| JP | 2000315823 A | 11/2000 |
| JP | 2001332770 A | 11/2001 |
| JP | 2006189519 A | 7/2006 |
| JP | 2007286611 A | 11/2007 |
| JP | 2008021650 A | 1/2008 |
| JP | 4107349 B2 | 6/2008 |
| JP | 2008537629 A | 9/2008 |
| JP | 2008258296 A | 10/2008 |
| JP | 2009105343 A | 5/2009 |
| JP | 2009267289 A | 11/2009 |
| JP | 4983347 B2 | 7/2012 |
| RU | 2322469 C2 | 4/2008 |
| WO | 2009001606 A1 | 12/2008 |
| WO | 2009001725 A1 | 12/2008 |
| WO | 2010021346 A1 | 2/2010 |

OTHER PUBLICATIONS

Extended European Search Report from International Publication PCT/JP2012/063748 dated Mar. 5, 2015.
Japanese Office Action for JP Application No. 2011135656, dated Feb. 24, 2015.
Chinese Office Action for Application No. 201280028161.0 dated Jul. 13, 2016.
Communication Pursuant to Article 94(3) EPC for EP Application No. 12800912.3 dated Apr. 3, 2017.
Chinese Office Action for Application No. 201280028161.0 dated Dec. 4, 2015, 9 pages.
European Search Opinion for Application No. 12800912.3 dated Mar. 5, 2015, 4 pages.
Japanese Office Action for Application No. 2011-135656 dated Jun. 9, 2015, 3 pages.
Russian Office Action for Application No. 2013154770, dated Jan. 26, 2016, 13 pages.
International Search Report for Application No. PCT/JP2012/063748 dated Jun. 26, 2012, 2 pages.
International Preliminary Report on Patentability for Application No. PCT/JP2012/063748 dated Dec. 17, 2013, 8 pages.
Russian Notice of Grant for Application No. 2596221 dated Mar. 30, 2017.

\* cited by examiner

[FIG. 1]
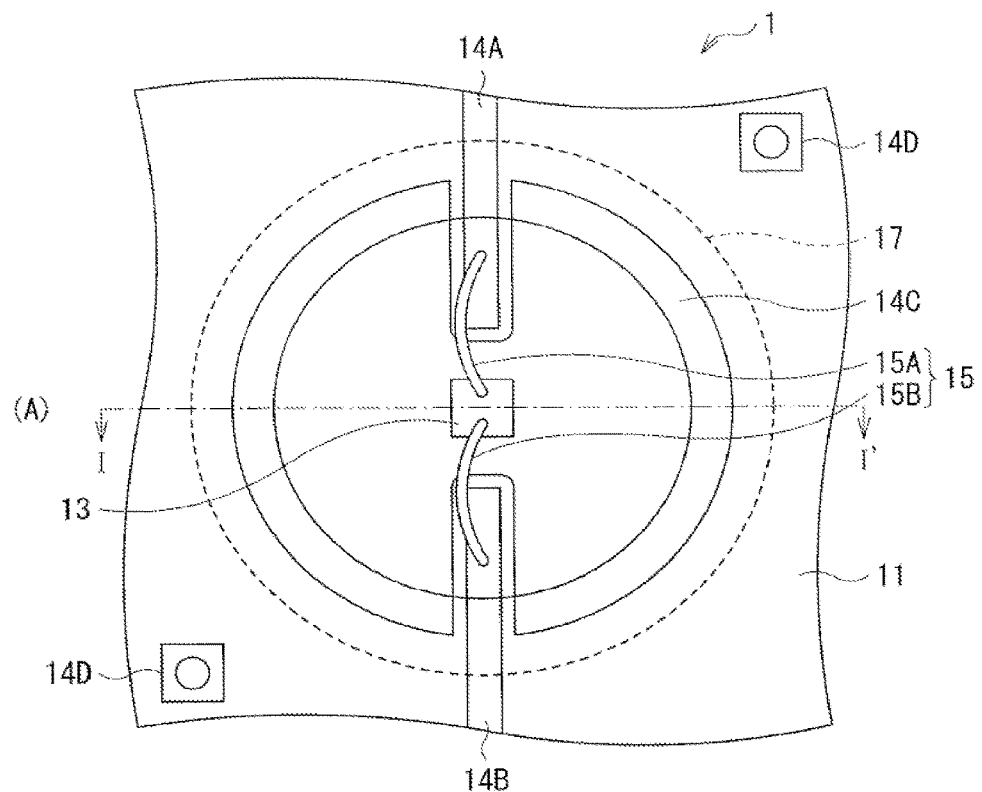
(A)
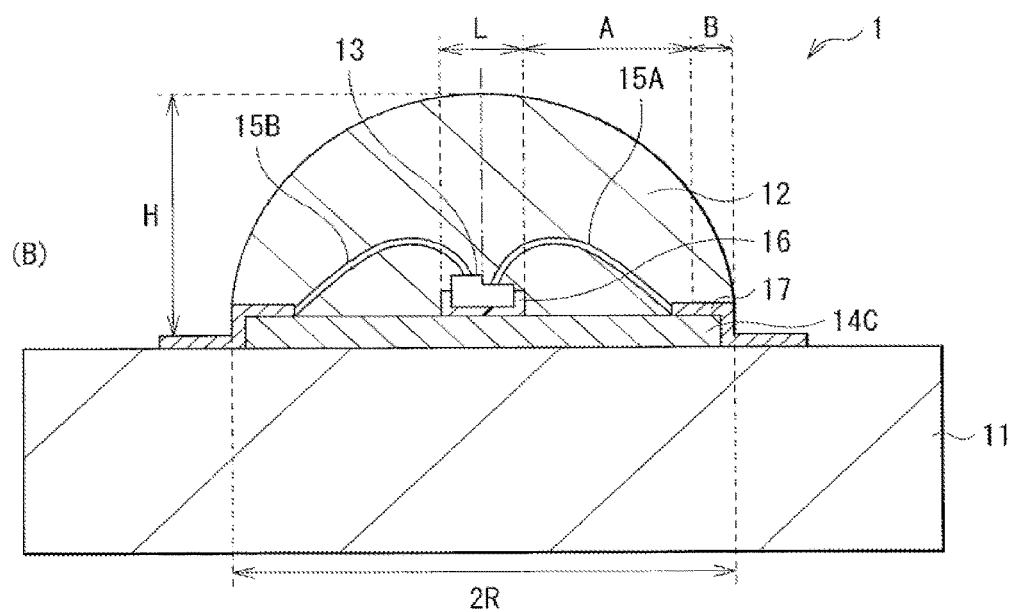
(B)

[ FIG. 2 ]
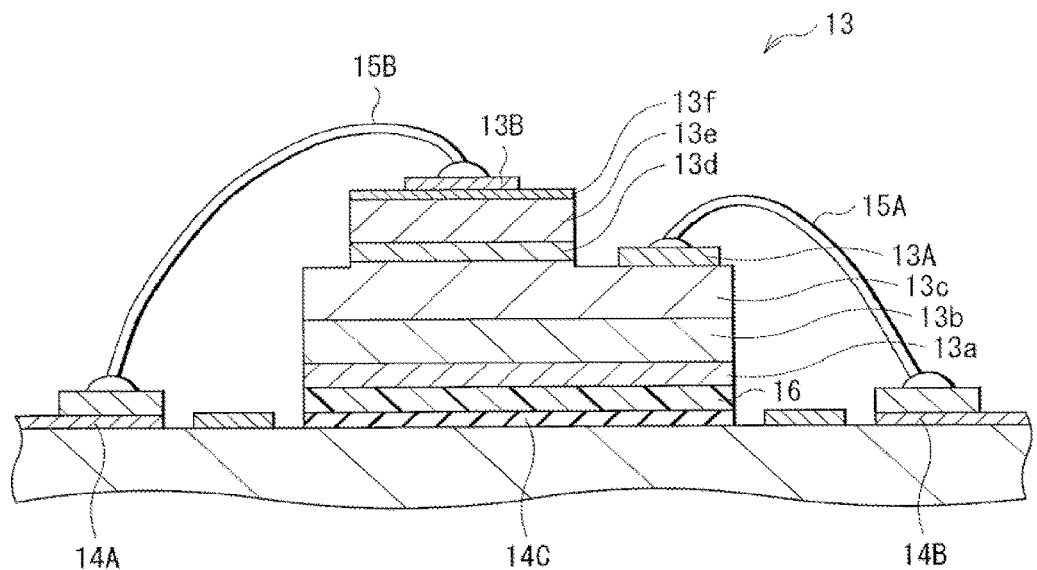
[ FIG. 3 ]
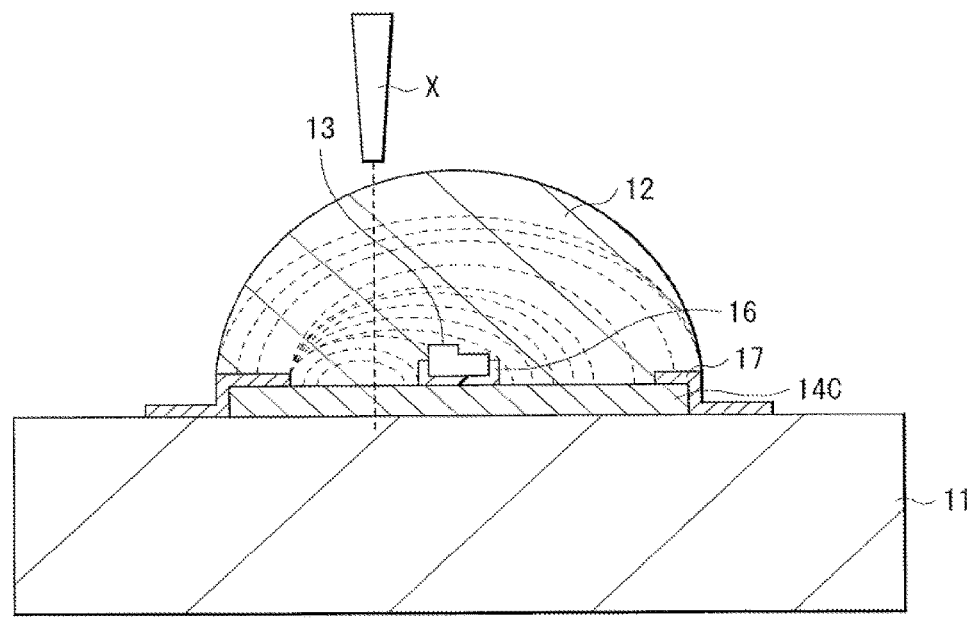

[ FIG. 4 ]
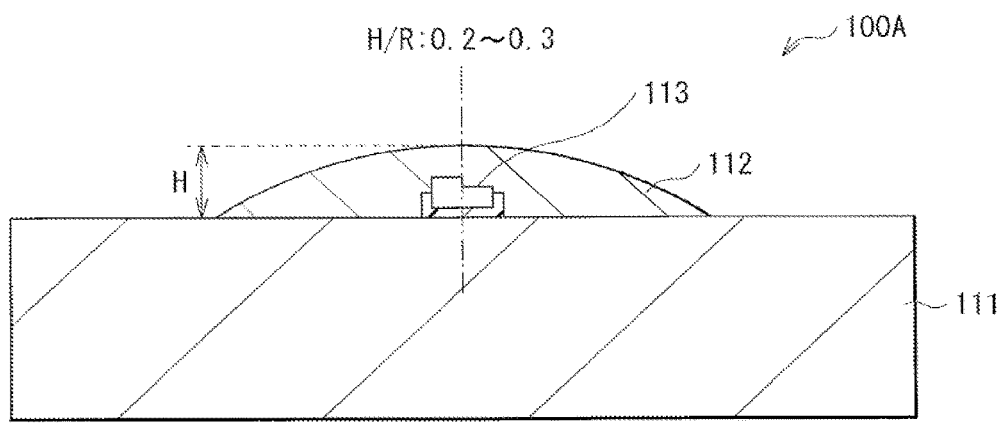
[ FIG. 5 ]
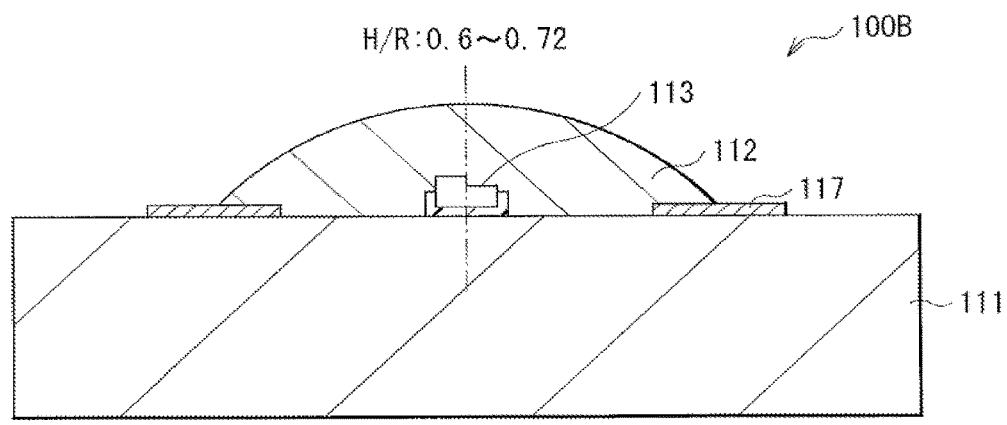

[ FIG. 6 ]
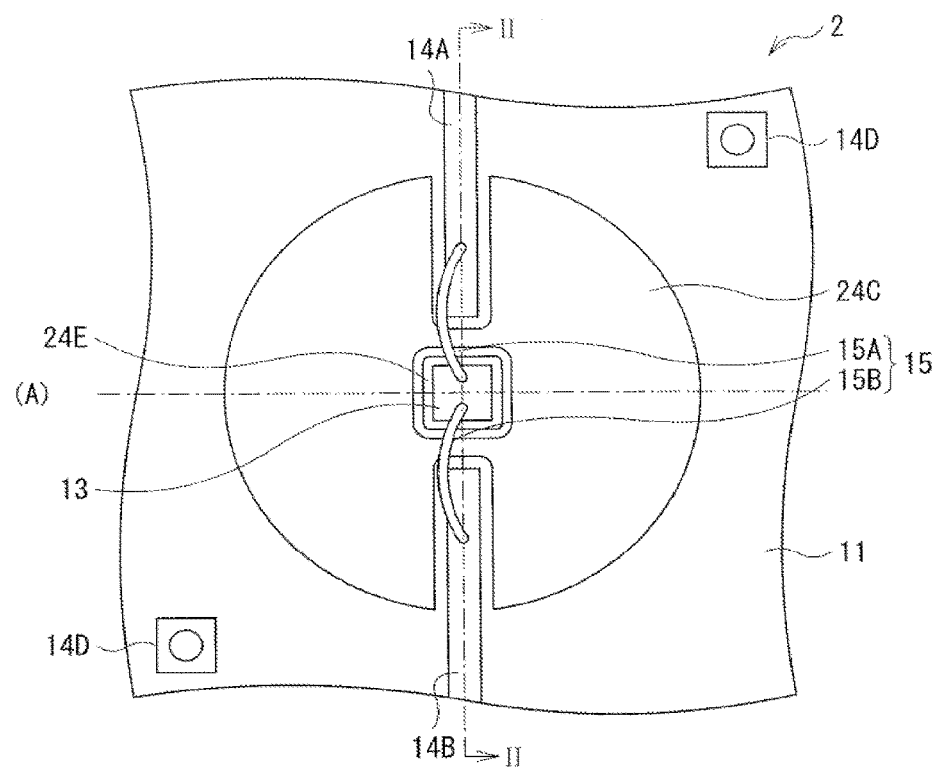
(A)
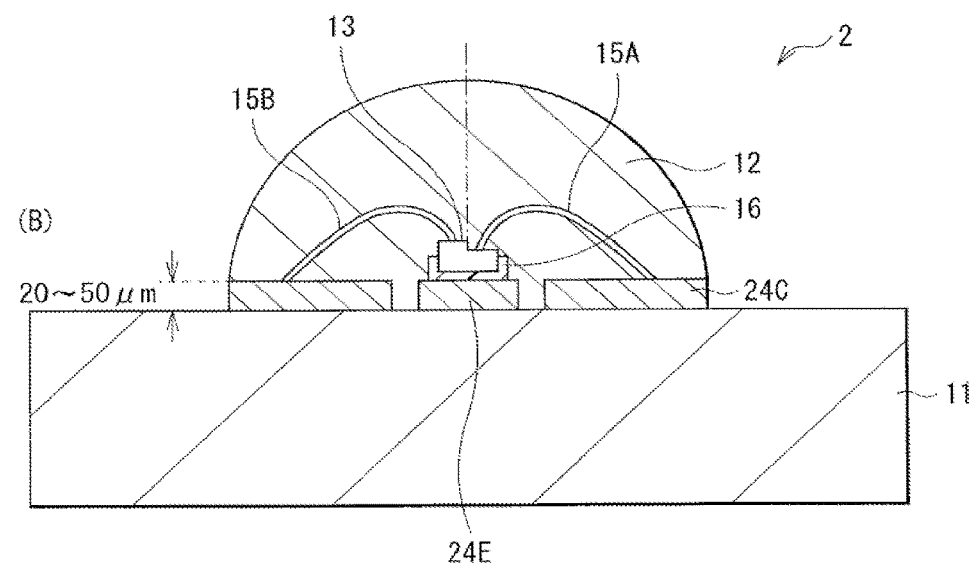
(B)

[ FIG. 7 ]
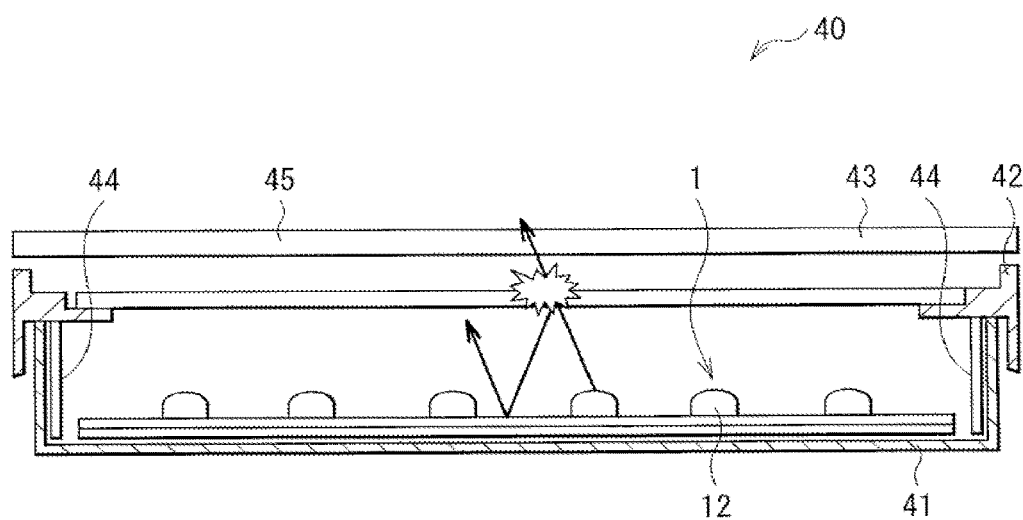

[FIG. 8]
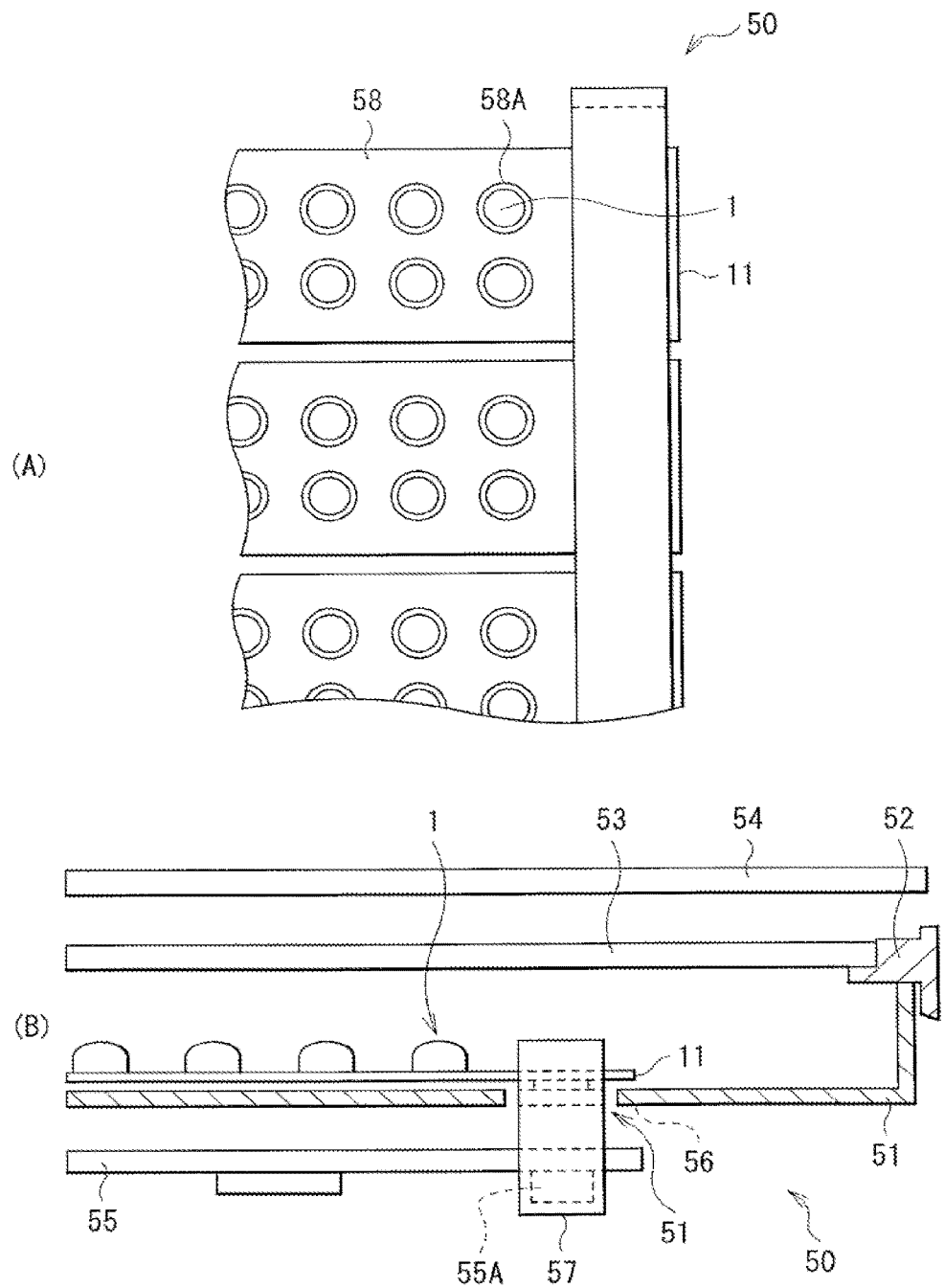

[ FIG. 9 ]
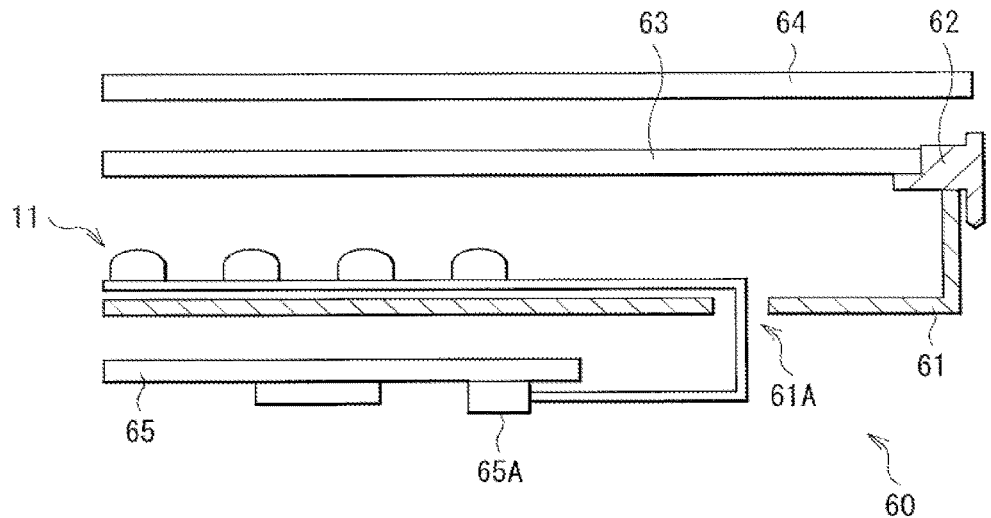
[ FIG. 10 ]
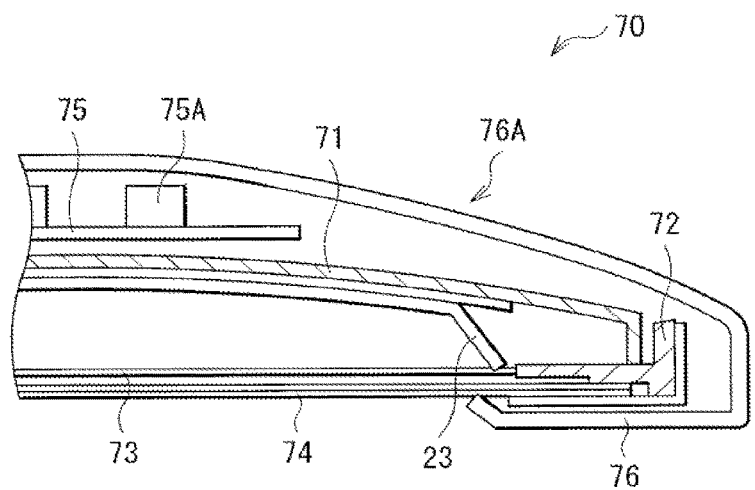

[ FIG. 11 ]
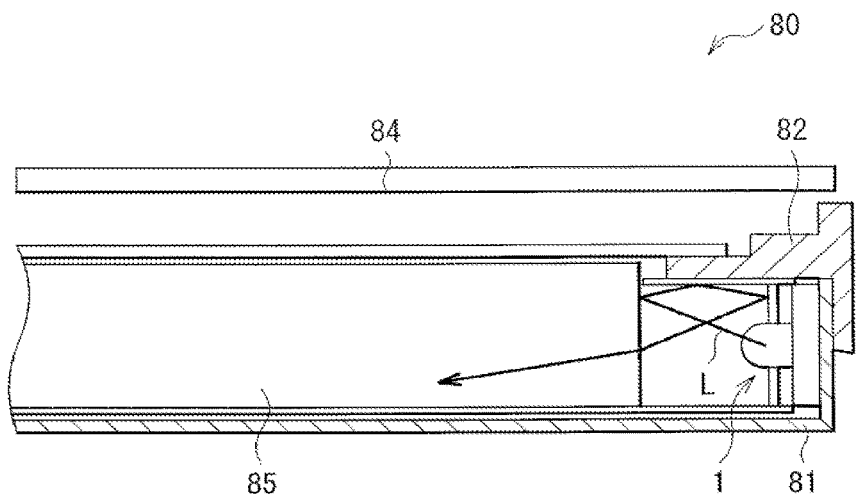
[ FIG. 12 ]
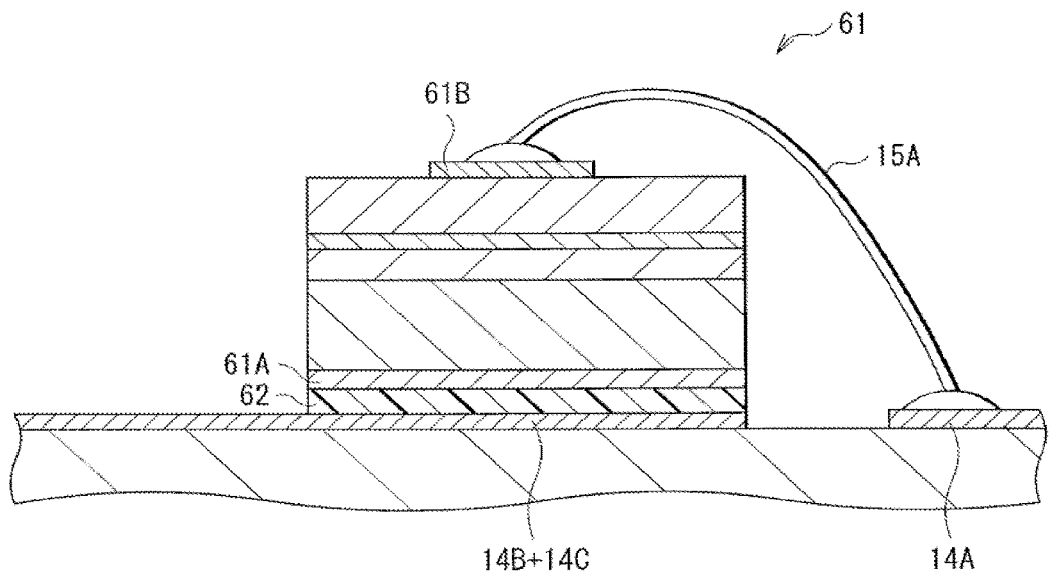

LIGHT SOURCE CIRCUIT UNIT, ILLUMINATOR, AND DISPLAY

CROSS REFERENCE TO RELATED APPLICATIONS

The present application is a continuation of U.S. patent application Ser. No. 15/679,904, filed Aug. 17, 2017, which is a continuation of U.S. patent application Ser. No. 15/208,214, filed Jul. 12, 2016, issued as U.S. Pat. No. 9,773,957 on Sep. 26, 2017 which is a continuation of U.S. patent application Ser. No. 14/713,628, filed May 15, 2015, and issued as U.S. Pat. No. 9,412,919 on Aug. 9, 2016, which is a continuation of U.S. patent application Ser. No. 14/125,161, filed Dec. 10, 2013, and issued as U.S. Pat. No. 9,059,382 on Jun. 16, 2015, which is a National Stage filing of International Application No. PCT/JP2012/063748, filed May 29, 2012, which claims the benefit of Japanese Patent Application No. 2011-135656, filed Jun. 17, 2011 in the Japan Patent Office, the disclosures of which are incorporated herein by reference.

TECHNICAL FIELD

The present disclosure relates to a light source circuit unit and an illuminator that use light-emitting devices such as LEDs (Light-Emitting Diodes) as a light source, as well as a display that includes such an illuminator as a backlight.

BACKGROUND ART

A light-emitting diode (LED) has drawn attention as a backlight (light source) for a liquid crystal display and the like, or as a light source for an illuminator that is alternative to an incandescent lamp and a fluorescent lamp.

Typically, an LED chip that is mounted on a substrate and the like is sealed with a sealant (sealing lens). This sealant uses silicon and the like as a main constituent material, and has a refractive index in the order of about 1.5. When light is incident from a material with the refractive index of 1.5 toward the air with the refractive index of 1.0, a critical angle may become about 41.8 degrees, and any light with an angle of incidence onto the front face of the sealing lens that exceeds 41.8 degrees may be totally reflected, resulting in preventing such light from being emitted externally. Further, for a light source using the LED, it is possible to obtain light with the wavelength different from that of light emitted by the LED in a manner of kneading a fluorescent material into the sealant. The fluorescent material that is kneaded into the sealant is excited by light irradiated by the LED to emit light almost uniformly in all directions. This shows that the light extraction efficiency is improved by allowing the sealing lens to have the shape that causes the largest amount of light emitted within the sealing lens to directly pass through the front face of the lens, that is, to have the hemispheric shape.

As a method of forming a sealing lens in the hemispheric shape, a resin sealing method for an LED chip has been disclosed that provides a resist layer at the outside of a sealing region to adjust a lens shape on the basis of a difference in the water-repellent property between the resist layer and a substrate (for example, see Patent Literature 1).

PRIOR ART DOCUMENT

Patent Literature

Patent Literature 1: Japanese Unexamined Patent Application Publication No. 2001-332770

SUMMARY OF INVENTION

However, such a sealing method has been disadvantageous in that practically a sealant gets onto the resist layer in a wet state, resulting in a lens in the form far from the hemispheric shape being only obtained. Consequently, satisfactory improvement of the light extraction efficiency has not been found.

It is therefore desirable to provide a light source circuit unit, an illuminator, and a display that improve the light extraction efficiency.

A light source circuit unit according to an embodiment of the present disclosure includes: a circuit substrate having a wiring pattern on a surface thereof, the wiring pattern having light reflectivity; a circular pedestal provided on the circuit substrate; a water-repelling region provided at least from a peripheral edge portion of the pedestal to a part of a side face of the pedestal; and one or two or more light-emitting device chips mounted on the pedestal, and driven by a current that flows through the wiring pattern.

Each of an illuminator and a display according to an embodiment of the present disclosure includes the above-described light source circuit unit.

In the light source circuit unit, the illuminator, or the display according to the embodiment of the present disclosure, the light-emitting device chip is mounted on the pedestal that has the water-repellent region from the peripheral edge portion to a part of the side face. Thereby, the sealing lens having a diameter almost identical to that of the pedestal and in an almost hemispheric shape is obtained.

In the light source circuit unit, the illuminator, and the display according to the embodiments of the present disclosure, the light-emitting device chip is mounted on the pedestal that has the water-repelling region from the peripheral edge portion to a part of the side face, and the sealing lens is provided on the pedestal. This forms the sealing lens having a diameter almost identical to that of the pedestal and in an almost hemispheric shape. Therefore, it is possible to efficiently extract light emitted by the light-emitting device chip.

BRIEF DESCRIPTION OF DRAWINGS

FIGS. 1 (A) and (B) of FIG. 1 are a plan view and a cross-sectional view respectively showing a light source circuit unit according to an embodiment of the present disclosure.

FIG. 2 is a schematic diagram showing an electrode configuration of an LED chip.

FIG. 3 is a schematic diagram for explaining a process of forming a sealing lens.

FIG. 4 is a cross-sectional view of a light source circuit unit according to a comparative example 1.

FIG. 5 is a cross-sectional view of a light source circuit unit according to a comparative example 2.

FIGS. 6 (A) and (B) of FIG. 6 are a plan view and a cross-sectional view respectively showing a light source circuit unit according to a modification example.

FIG. 7 is a cross-sectional view showing a liquid crystal display according to an application example 1.

FIGS. 8 (A) and (B) of FIG. 8 are a plan view and a cross-sectional view for a principal part respectively showing a liquid crystal display according to an application example 2.

FIG. 9 is a cross-sectional view showing a liquid crystal display according to an application example 3.

FIG. 10 is a cross-sectional view showing a liquid crystal display according to an application example 4.

FIG. 11 is a cross-sectional view showing a liquid crystal display according to an application example 5.

FIG. 12 is a schematic diagram showing a wiring configuration of another LED chip.

DESCRIPTION OF EMBODIMENTS

Hereinafter, embodiments of the present disclosure are described in details with reference to the attached drawings. It is to be noted that the descriptions are provided in the order given below.

Embodiment (an example where an LED chip is mounted on a pedestal having a water-repelling region from a peripheral edge portion to the side face thereof)
Modification Example (an example where a pedestal is formed of a water-repellent agent)
Application Example 1 (an example of a direct-type backlight)
Application Example 2 (an example of a divided substrate)
Application Example 3 (an example where a circuit substrate in a folded-back state is connected with a drive substrate at the back side of a supporting member)
Application Example 4 (an example where a circuit substrate is curved along with a supporting member)
Application Example 5 (an example of an edge-type backlight)

Embodiment (A) of FIG. 1 shows a planar structure of a light source circuit unit 1 according to an embodiment of the present disclosure, and (B) of FIG. 1 shows a cross-sectional structure of the light source circuit unit 1 in an I-I' dashed line illustrated in (A) of FIG. 1. The light source circuit unit 1, which may be used as a backlight for a display such as a liquid crystal display and the like, or as a light source circuit unit that is alternative to an incandescent lamp and a fluorescent lamp, includes a light-emitting device chip, for example, an LED chip 13, that is covered with a dome-like sealing lens 12 on a circuit substrate 11. The number of the LED chips 13 is one in this example, although the number may be two or more, and a large number of the LED chips 13 may be used in a matrix pattern when they are applied to a direct-type backlight.

On the front face of the circuit substrate 11, there is provided a wiring pattern 14 with light reflectivity. The wiring pattern 14 may include, for example, a wiring layer 14A and a wiring layer 14B for supplying a drive current to the LED chip 13, as well as a pedestal 14C for mounting the LED chip 13 thereon. These wiring layers 14A and 14B, as well as the pedestal 14C have electrical conductivity, and are formed of materials having the light reflectivity using the same process, being electrically independent with respect to one another. It is to be noted that, in the present embodiment, the pedestal 14C only has a function as a pedestal for the LED chip 13 and a function of determining a shape and a position of the sealing lens 12, and does not have an original wiring function. Further, the wiring pattern 14 also includes an alignment mark 14D to be used at the time of mounting the LED chip 13 on the pedestal 14C and forming a water-repelling region (water-repelling layer 17). Two alignment marks 14D are provided on a diagonal line of the pedestal 14C on the basis of a line connecting the wiring layers 14A and 14B, and forming these alignment marks 14D by the use of the same process and plate (mask) as with the pedestal 14C makes it possible to facilitate an alignment of a lens center of the sealing lens 12 with a center of the LED chip 13. It is to be noted that here the "light reflectivity" refers to a case where the reflectivity for the light emitted by the LED chip 13 (light emitted from back side) has a high value of 90% or more. Specific examples of materials having such light reflectivity may include aluminum (Al), silver (Ag), an alloy of these materials, or the like. However, Al may be the most preferable in terms of cost. Further, two alignment marks 14D are provided on a diagonal line in this example, although the number of the alignment marks 14D is not limited thereto, but four alignment marks 14D may be alternatively provided to surround the pedestal 14C.

It is to be noted that the wiring layers 14A and 14B, the pedestal 14C, and the alignment mark 14D may be preferably formed of the same materials using the same process to simplify the process as described above, although the pedestal 14C may be formed of any materials different from those of the wiring layers 14A and 14B as well as the alignment mark 14D using any different process.

As shown in an example in FIG. 2, the LED chip 13 may have two electrodes (n-type electrode 13A and p-type electrode 13B) on the front face thereof. The LED chip 13 may be configured of, for example, a buffer layer 13b that is formed on a transparent substrate 13a, an n-type cladding layer 13c, an active layer 13d, a p-type cladding layer 13e, and a cap layer 13f. The n-type electrode 13A is electrically connected with the n-type cladding layer 13c, and the p-type electrode 13B is electrically connected with the cap layer 13f.

The n-type electrode 13A and the p-type electrode 13B of the LED chip 13 are electrically connected with the wiring layers 14A and 14B through wires (bonding wires) 15A and 15B of aluminum (Al), gold (Au), or any other material, respectively. In other words, the LED chip 13 is driven by a current flowing through the wiring layers 14A and 14B as well as the wires 15A and 15B, thereby emitting light.

In the present embodiment, this LED chip 13 is mounted directly on the pedestal 14C. Hereupon, the word "directly" means that the back side itself of the LED chip 13 (above-described transparent substrate) is firmly fixed to the pedestal 14C by means of die bonding and the like without incorporating the LED chip 13 into a package or without providing a reflective layer such as a tin- or gold-plated layer between the pedestal 14C and the LED chip 13. As shown in FIG. 1, however, an adhesive layer such as a transparent paste 16 for die bonding may be interposed between the pedestal 14C and the LED chip 13. It is to be noted that, in the present embodiment, the transparent paste 16 has no electrical conductivity, although as described later, when an LED chip having electrodes on both sides is to be used, the transparent paste 16 has the electrical conductivity because the pedestal 14C has a function as a current path.

The circuit substrate 11 may be preferably flexible and foldable, and in concrete terms, any material in which the wiring pattern 14 is printed on a resin film made of PET (polyethylene terephthalate), fluorine, PEN (polyethylene naphthalate), or the like may be used for the circuit substrate 11. The resin film may have, for example, a film thickness within a range of 20 μm to 50 μm, and the wiring pattern 14 may have, for example, a thickness within a range of 35 μm to 50 μm, although the thickness values are not limited thereto.

In addition, as the circuit substrate 11, any material in which a wiring pattern of the above-described reflective quality of material is printed on a relevant insulating resin layer on a metal-based substrate made of Al and the like where the insulating resin layer configured of polyimide, epoxy-based, or any other material is formed on the front face may be used alternatively. Further, any material in which a wiring pattern of the above-described reflective quality of material is printed on a film substrate that is made of a glass-containing resin, such as FR4 (glass epoxy resin) and CEM3 (glass composite resin) may be used.

The sealing lens 12 has a dome-like shape, and protects the LED chip 13 and improves the extraction efficiency of light that is emitted out of the LED chip 13. This sealing lens 12 may be configured of, for example, a transparent resin such as silicon and acrylic resin, and is formed to cover a whole area of the LED chip 13. Further, as described above, this sealing lens 12 may include a fluorescent material. For example, it is possible to adjust a color tone of light that is emitted out of the LED chip 13 by kneading a fluorescent material into a transparent resin such as silicon and acrylic resin with a weight ratio of, for example, 10 wt. %. In other words, when light at a predetermined wavelength is irradiated from the LED chip 13, a fluorescent material contained in the sealing lens 12 is excited to emit light at a wavelength different from that of the irradiated light. For the fluorescent material, for example, an yttrium aluminum garnet (YAG) fluorescent material and the like may be used.

As is the case for the present embodiment, for the LED chip 13 that is mounted directly on the pedestal 14C which is provided on the circuit substrate 11, and that involves bonding wires 15A and 15B for providing a power supply, a bottom of the sealing lens has a size large enough to prevent the bonding wires 15A and 15B from running over. More specifically, as shown in (B) of FIG. 1, a lens radius R of the sealing lens 12 becomes a value obtained by adding a length A of the bonding wire 15A (or the bonding wire 15B) from an end face of the LED chip 13 and a margin B that absorbs any manufacturing variations, such as a length or a connecting location of the bonding wire 15A (15B) and a formation position or a size (lens radius R) of the sealing lens 12, to a value equivalent to a half of a chip size L. A length for each of the bonding wires 15A and 15B is determined along with a wire diameter compatible with strength necessary for the reliability that is demanded by an applicable product. Further, a margin for manufacturing variations is determined depending on the accuracy of manufacturing equipment in use. As an example, the lens radius R of the sealing lens 12 in the case where the LED chip 13 with the chip size L of 510 μm is used may become the following value. For example, in assuming a backlight for a liquid crystal display, a diameter φ and the wire length A of a bonding wire may become 25 μm and 0.7 mm, respectively. Each positional accuracy of the bonding equipment may be about +/−0.03 mm, each positional accuracy of a lens center may be about +/−0.1 mm, and a positional accuracy of a lens radius in accordance with a silicon coating amount may be about +/−0.12 mm. Based on this assumption, given that a gap between a bonding wire and the sealing lens 12 is 0.3 mm, the margin B in this case is obtained by the following expression: B=0.03+0.1+0.12+0.3=0.55 mm. Therefore, a design value of the lens radius R for the sealing lens 12 may become about 1.6 mm from the following expression: R=0.255+0.7+0.55.

Further, the sealing lens 12 according to the present embodiment has an approximately hemispherical shape with a ratio of a radius R to a height H of a bottom of the sealing lens 12 (aspect ratio H/R) of 0.8 or more, preferably, 0.85 or more, particularly among other dome-like shapes. As described previously, when silicon is used as a material for the sealing lens 12, due to a difference in the refractive index between the air and silicon, light incoming onto the front face of the sealing lens 12 is totally reflected into the inside of the sealing lens 12 if an incident angle exceeds a critical angle (41.8 degrees). Additionally, for the sealing lens 12 in which a fluorescent material is kneaded, the fluorescent material is excited when light which is emitted out of the LED chip 13 is applied onto the fluorescent material contained in the sealing lens 12, thereby emitting light at a wavelength different from that of the light from the LED chip 13. On this occasion, in addition to the light that is emitted out of the LED chip 13, the fluorescent material also emits light almost uniformly in all directions. Accordingly, to improve the extraction efficiency of emitted light within the sealing lens 12, a lens shape of the sealing lens 12 may be preferably formed in such a manner that an angle of incidence onto the front face of the lens for the light that is emitted almost uniformly in all directions becomes equal to or less than the critical angle. It is found that more preferably the sealing lens 12 may be in a shape allowing light to pass through the sealing lens 12 in a state where the incident angle is close to zero degree, that is, in a hemispherical shape.

The sealing lens 12 in such a shape is obtained by providing the pedestal 14C between the LED chip 13 and the circuit substrate 11.

As described above, the pedestal 14C is the wiring pattern 14 that is formed using the same process and plate as with the wiring layers 14A and 14B, and mounts the LED chip 13 thereon and determines an outer diameter of the sealing lens 12. This pedestal 14C takes a circular form, and a radius R thereof is served as a design value for the lens radius R of the sealing lens 12. Further, a thickness of the pedestal 14C may be at least equal to or greater than a thickness (diameter) of a constituent material for the sealing lens 12, for example, a silicon atom. The thickness may be preferably within a range of 20 μm to 50 μm, thereby allowing the sealing lens 12 to be formed in an approximately hemispherical shape. The pedestal 14C is formed with the water-repelling layer 17 from a peripheral edge portion to the side face thereof and the circuit substrate 11 at the periphery of the pedestal 14C. It is to be noted that the "circular form" as used herein may not be necessarily a precise circular form. More specifically, if it is possible to form the above-described sealing lens 12 in an approximately hemispherical shape, the circular form may have any uneven portion on the circumference. Additionally, here the water-repelling layer 17 is formed on the side face and over a whole peripheral region of the pedestal 14C in addition to a peripheral edge portion of the pedestal 14C, although an area where the water-repelling layer 17 is formed is not limited thereto, but the water-repelling layer 17 may be at least formed in continuity at a peripheral edge portion and a part of the side face of the pedestal 14C.

The water-repelling layer 17 forms the sealing lens 12 in a predetermined shape and at a predetermined position in conjunction with the pedestal 14C. After mounting of the LED chip 13 on the pedestal 14C on which the water-repelling layer 17 is formed, when potting of a sealant is performed on the pedestal 14C, the sealant runs upon the water-repelling layer 17 that is provided at a peripheral edge portion of the pedestal 14C. When the potting is continued as it is, the sealant spreads with a certain contact angle kept along an inside diameter of the water-repelling layer 17 to reach an outer edge of the pedestal 14C in due course. The sealant that has reached the outer edge takes a spherical form gradually without spilling out of the pedestal 14C by virtue of the water-repelling property of the water-repelling layer 17 and the surface tension of the sealant itself. On this occasion, the water-repelling layer 17 may preferably have a film thickness ensuring that a bump between the pedestal 14C and the circuit substrate 11 is bridged and an edge portion of the outer edge does not take a sloped form, for example, a film thickness within a range of 1 μm to 2 μm. The water-repelling layer 17 may be formed of, for example, a water-repelling agent such as a fluorocarbon resin.

It is to be noted that a white-color resist layer (not shown in the drawing) may be provided between the wiring layers 14A and 14B and an outer circumferential portion of the sealing lens 12. Further, the white-color resist layer may be also provided on the circuit substrate 11 between the pedestal 14C within a region covered by the sealing lens 12 and the wiring layers 14A and 14B. Examples of such a white-color resist may include an inorganic material such as titanium oxide ($TiO_2$) microparticle and barium sulfate ($BaSO_4$), and an organic material such as porous acrylic resin microparticle having a countless number of pores for light scattering and polycarbonate resin microparticle. In concrete terms, a solder resist FINEDEL DSR-330S42-13W (product name, TAMURA KAKEN CORPORATION) and the like are available. These white-color resist layers may cause deterioration in the reflectivity due to heating during bonding and any other factor, although they have a light reflection functionality (reflectivity in the order of a first half of 80%).

The light source circuit unit 1 may be manufactured using, for example, the following processes.

First, on the circuit substrate 11, a solid Al film with a thickness, for example, within a range of 20 μm to 50 μm is formed, and thereafter the wiring layers 14A and 14B, the pedestal 14C, and the alignment mark 14D are formed thereon. On this occasion, the pedestal 14C is in a circular form with the same radius as the radius R of the designed sealing lens 12 as described above. Subsequently, after a transparent paste 16 is applied on the pedestal 14C, alignment is performed using the alignment mark 14D, and the LED chip 13 is mounted in a manner of ensuring an alignment of a center of the pedestal 14C with a center of the LED chip 13. Then, the LED chip 13 is fixed firmly on the pedestal 14C through heat hardening. Afterward, connection among two electrodes (n-type electrode 13A and p-type electrode 13B) on the LED chip 13 and the wiring layers 14A and 14B is carried out using the above-described wires 15A and 15B through wire bonding.

Next, a water-repelling agent is applied circularly over an area from a peripheral edge portion of the pedestal 14C to a peripheral part of the pedestal 14C to form the water-repelling layer 17 with a film thickness within a range of 1 μm to 2 μm, and thereafter potting of a moderate amount of sealant (for example, silicon resin or the like) is performed on the pedestal 14C. A "moderate amount" as used herein refers to an amount that allows the sealant to keep the surface tension thereof without spilling down from the pedestal 14C. In concrete terms, for a sealant with the viscosity in the order of 500 mPa, provided that an amount of a sealant reaching the outer circumferential portion of the pedestal 14C while keeping a contact angle along the water-repelling layer 17 is assumed to be 100%, a sealant of as much as 125% or more may be preferably applied. More preferably, the amount may be at least 125% but no more than 202%, thereby allowing to obtain the sealing lens 12 in an approximately spherical form with an aspect ratio of 0.85 or more.

FIG. 3 shows a potting process of a sealant in forming the sealing lens 12. When a position of a coating nozzle X is aligned with a center of the LED chip 13, a potted sealant spreads stepwise symmetrically relative to a center of the LED chip 13. Once a sealant increases up to the amount that causes it to run upon the water-repelling layer 17, it spreads while keeping a certain contact angle with the water-repelling layer 17 along an inside diameter of the water-repelling layer 17. As shown in FIG. 3, however, when a position of the coating nozzle X is misaligned from a center of the LED chip 13, first of all, a sealant reaches a position (right-end side in the drawing) that is closest to an inside diameter of the water-repelling layer 17 and an outer diameter of the pedestal 14C. If injection of a sealant is still continued even after a sealant has reached an inside diameter of the pedestal 14C, a sealant runs upon the water-repelling layer 17, and then reaches an outer edge of the pedestal 14C. Subsequently, if a sealant is further injected, it runs out of the pedestal 14C, but remains in the pedestal 14C without spilling off because it attempts to round by virtue of the surface tension of the sealant itself. Moreover, if injection of a sealant is continued, a sealant spreads in a direction (left-end side in the drawing) away from an inside diameter of the water-repelling layer 17 and an outer diameter of the pedestal 14C along an outer edge of the pedestal 14C to cover a whole area of the pedestal 14C eventually. As described above, in the present embodiment, a position of the pedestal 14C becomes a position for forming the sealing lens 12 directly.

It is to be noted that when a sealant is further injected in a state where the sealant covers a whole area of the pedestal 14C, the sealant remains at an outer edge of the pedestal 14C by virtue of the surface tension thereof, and increases a droplet height gradually, resulting in taking an approximately hemispherical form with an aspect ratio (H/R) of 0.85 or more. However, if injection exceeding the surface tension of a sealant is carried out, the sealant becomes unable to support its own weight, spilling out of the pedestal 14C. Accordingly, for the injection amount of a sealant, it may be desirable that an intermediate value between an amount necessary for covering a whole area of the pedestal 14C and a limit amount for preventing a sealant from spilling out of the pedestal 14C be used as the application amount in consideration of variation in the injection amount. This application amount is at least 125% but no more than 202% as described above.

Following application of a sealant on the pedestal 14C, the sealant is hardened by heating it, for example, at temperature of 150 degrees centigrade for four hours. This allows to form the sealing lens 12 in an approximately hemispherical form with an aspect ratio (H/R) of 0.85 or more, and to obtain the light source circuit unit 1 illustrated in FIG. 1.

It is to be noted that here the water-repelling layer 17 is formed after die bonding and wire bonding of the LED chip 13 onto the pedestal 14C, although a method is not limited thereto, but die bonding and wire bonding of the LED chip 13 onto the pedestal 14C may be carried out after the water-repelling layer 17 is formed.

In the light source circuit unit 1 according to the present embodiment, the pedestal 14C having the water-repelling layer 17 at a peripheral edge portion and a part of the side face thereof is provided on the circuit substrate 11 to mount the LED chip 13 thereon. By providing the sealing lens 12 on the pedestal 14C, the sealing lens 12 takes an approximately hemispherical form with an aspect ratio (H/R) of 0.85 or more. This improves the extraction efficiency of light that is emitted out of the LED chip 13. Hereinafter, this is further described.

Comparative Example 1

FIG. 4 shows a light source circuit unit 100A where an LED chip 113 is die-bonded directly on a circuit substrate 111, as with the light source circuit unit 1 according to the present embodiment. On the front face of the circuit substrate 111, a base material itself (for example, glass epoxy or resin film) for the substrate is used, or a white-color resist agent or a metallic layer made of Ag, Ai, or the like that is served as a wiring pattern is provided. When a sealing lens 112 is formed by applying a sealant on such a circuit substrate 111, because the front face of the circuit substrate 111 has low water-repelling property against a sealant, an aspect ratio (H/R) becomes within a range of about 0.2 to 0.3, resulting in taking a shape far from the above-described ideal lens form (hemispherical form) as shown in FIG. 4.

Comparative Example 2

FIG. 5 shows a light source circuit unit 100B where a circular water-repelling layer 117 is provided around an LED chip 113 that is mounted on a circuit substrate 111. In this light source circuit unit 100B, because a sealant that is potted on the LED chip 113 gets onto the water-repelling layer 117 in a wet state, and keeps a contact angle on the water-repelling layer 117, it is possible to maintain a height H of a lens as compared with the sealing lens 112 according to the above-described comparative example 1. Even in such a configuration, however, an aspect ratio (H/R) is improved only inasmuch as 0.6 to 0.72, and the satisfactory extraction efficiency is not achieved.

Further, like the comparative example 2, when the water-repelling layer 117 is provided around the LED chip 113, a position for forming the sealing lens 112 depends on the water-repelling layer 117. Like the present embodiment, as well as the comparative examples 1 and 2, in the light source circuit unit where the LED chip is die-bonded directly on the circuit substrate, an alignment mark is typically provided on the substrate for alignment of a mounting location of the LED chip. This alignment mark is also used for alignment in forming the water-repelling layer 117, but each of mounting of the LED chip 113 onto the circuit substrate 111 and formation of the water-repelling layer 117 is carried out using a different process and independent equipment. The chip mounting positional accuracy of currently available die bonding equipment is within a range of +/−20 µm to 30 µm, the substrate positioning accuracy of water-repelling agent application equipment is within a range of +/−20 µm to 30 µm, the positioning accuracy of a plate for the water-repelling agent is within a range of +/−20 µm to 30 µm, and the plate pattern positional accuracy is within a range of +/−20 µm to 30 µm. Consequently, a center of the LED chip 113 and a center position of the circular water-repelling layer 117 may vary by about 100 µm. This results in a disadvantage that a displacement arises between a center of the LED chip 113 and a center of the sealing lens 112.

As described above, in a light source circuit unit where a center of an LED chip and a center position of a sealing lens are misaligned, the intensity of light that is emitted from the LED chip becomes stronger at a location closer to the LED chip. Therefore, dispersion of the light intensity (light distribution) for each angle of light that is emitted to the outside of a lens is not symmetrical relative to a center of the LED chip. Further, in a light source circuit unit where a fluorescent material exhibiting the luminescence different from light that is emitted from the LED chip is kneaded in the sealing lens 112, any variation arises in a distance from the LED chip to the front face of the sealing lens due to misalignment in a center position between the LED chip and the sealing lens. This may also cause a disadvantage that the amount of the fluorescent material present in each direction does not become constant, resulting in the chromaticity being deviated from a target thereof.

Like the present embodiment, as well as the comparative examples 1 and 2, in the light source circuit unit (direct mounting-type LED) where the LED chip is mounted directly on the circuit substrate, it is possible to reduce costs significantly by virtue of less component count, the reduced number of manufacturing processes, and the like as compared with a light source circuit unit using a packaged LED chip (package-type LED) that has been typically in use. On the contrary, a display using the direct mounting-type LED as a backlight has been disadvantageous in that it has greater chromaticity unevenness and particulate unevenness than a display using the package-type LED. One reason for this is as follows.

In concrete terms, the package-type LED has an LED chip that is mounted on a lead frame, wherein a reflecting plate that is attached like a cone shape centering around this LED chip, a housing, and the like are provided, and a space surrounded by these component parts is sealed by a sealant. Since finished package-type LEDs have large variation in the luminance, chromaticity, drive voltage, or the like, they are inspected individually for the luminance or chromaticity after manufacturing, and then are sorted for each of the LEDs having the nearly identical characteristics to be used for a light source circuit unit. Accordingly, a light source circuit unit using the plurality of package-type LEDs makes it possible to suppress any variations in the luminance and chromaticity. On the other hand, for the direct mounting-type LED, sorting of the LEDs for each of the luminescent characteristics is not possible because such an LED is mounted directly on a circuit substrate. As a result, any variations in the luminance and chromaticity may arise within a light source circuit unit. Therefore, to reduce the chromaticity unevenness and particulate unevenness that may occur in using the direct mounting-type LED as a backlight for a display, it has been an issue to reduce variations in manufacturing.

In the light source circuit unit 1 according to the present embodiment, the LED chip 13 is mounted on the pedestal 14C that has the water-repelling layer 17 from a peripheral edge portion to a part of the side face, and a sealant is applied on the pedestal 14C to form the sealing lens 12. In applying a sealant on the pedestal 14C, the water-repelling layer 17 that is provided at the peripheral edge portion and the side face of the pedestal 14C makes it possible to control a spread of a sealant and to increase a height of the sealing lens 12, for example, to improve the aspect ratio (H/L) inasmuch as about 0.9 (more specifically, within a range of 0.85 to 0.98), thereby allowing to form the sealing lens 12 in a nearly hemispherical form that is an ideal lens shape. This improves the light extraction efficiency of the light source circuit unit 1 by about 5 to 10% as compared with the comparative example 2.

Further, in the light source circuit unit 1 according to the present embodiment, the pedestal 14C is served as a position for forming the sealing lens 12 directly. This eliminates the necessity for considering a displacement in forming the water-repelling layer 117 as found in the comparative example 2. Additionally, in the present embodiment, as a part of the wiring pattern 14, the alignment mark 14D is formed along with the pedestal 14C in the same process and the same plate. This improves the alignment accuracy in mounting the LED chip 13 on the pedestal 14C. In other words, any misalignment between a center of the LED chip 13 and a center of the sealing lens 12 is reduced, and dispersion of the light intensity (light distribution) for each angle of light that is emitted to the outside of the sealing lens 12 becomes symmetrical relative to a center of the LED chip 13. More specifically, any variations in the chromaticity, extraction efficiency, and light distribution of the LED chip 13 provided with the sealing lens are reduced, and thus any luminance unevenness such as particulate unevenness that may occur in using the light source circuit unit 1 according to the present embodiment as a backlight is reduced. This makes it possible to provide a display that is provided with the characteristics equivalent to those of a display using the package-type LED as a backlight at low cost.

In concrete terms, in the above-described comparative example 2, a position of an outer diameter for the sealing lens 112 conforms to an inside diameter of the water-repelling layer 117, and an outer diameter of the sealing lens 112 conforms to the application amount of a sealant. Therefore, a variation in the radius R of the sealing lens 112 was +/−0.12 mm, and a variation in the alignment between a center of the LED chip 113 and a center position of the sealing lens 112 was +/−0.13 mm. On the contrary, in the present embodiment, as described above, an outer diameter of the sealing lens 12 coincides with an outer diameter of the pedestal 14C. Consequently, a variation in the outer diameter of the sealing lens 12 becomes congruent with a variation in the outer diameter of the pedestal 14C, that is, becomes the print accuracy. A variation in the alignment between a center of the LED chip 13 and a center position of the sealing lens 12 is equivalent to a value obtained by adding the accuracy of the die bonding equipment to be used for the LED chip 13 to the positional accuracy, that is, the print accuracy between the alignment mark 14D and a center of the pedestal 14C. When printing of the wiring layers 14A and 14B, the pedestal 14C, and the alignment mark 14D is performed using a photoresist, because the positional accuracy becomes+/−several micrometers, and the plate pattern form accuracy becomes about +/−0.05 mm, a variation in the lens radius R is +/−0.05 mm, a variation in the alignment between a center of the LED chip 13 and a center position of the sealing lens 12 is +/−0.03 mm plus several micrometers, resulting in a variation in the outer diameter of the lens and lens position being also reduced significantly.

Additionally, in the present embodiment, the LED chip 13 is mounted on the pedestal 14C that is made of a conductive material, and thus any heat that is generated in the LED chip 13 is transferred to the pedestal 14C. In other words, the heat dissipation effect is achieved to improve the operating characteristics (luminous efficiency) and the life property of the LED chip 13.

Hereinafter, the description is provided on a modification example for the above-described embodiment. Any component parts essentially same as those in the above-described embodiment are denoted with the same reference numerals, and the related descriptions are omitted as appropriate, and the descriptions on effects in common are also omitted as appropriate.

Modification Example (A) of FIG. 6 shows a planar structure of a light source circuit unit 2 according to this modification example, and (B) of FIG. 6 shows a cross-sectional structure of the light source circuit unit 2 in an II-II dashed line illustrated in (A) of FIG. 6. The light source circuit unit 2 according to this modification example is different from the light source circuit unit 1 according to the above-described embodiment in that a pedestal 24C is formed of a water-repellent agent. Further, the LED chip 13 is mounted on a chip mounting layer 24E that is formed using the same material and the same process as with the wiring layers 14A and 14B as well as the alignment mark 14D. It is to be noted that a shape such as a thickness of the pedestal 24C is the same as with the above-described pedestal 14C. Further, in this modification example, the LED chip 13 is mounted on the chip mounting layer 24E that is made of the same material as the wiring pattern 14, although the LED chip 13 may be mounted on the pedestal 24C that is formed of a water-repellent agent. However, the LED chip may be preferably mounted on the chip mounting layer 24E in consideration of ease of bonding, the heat dissipation effect resulting from use of a conductive material, and the like.

In the light source circuit unit 2 according to this modification example, the pedestal 24C is formed of a water-repellent agent, thereby omitting a process of forming a water-repellent layer to reduce the number of processes in manufacturing processes for the light source circuit unit 2.

The above-described light source circuit units 1 and 2 are foldable, and may be applicable to illuminators for various applications, such as street lightings and surgical lightings. Further, they are applicable as a backlight (illuminator) for a display such as a liquid crystal display. In such a case, each of them is applicable as both of a direct type where a light source unit is arranged directly underneath a liquid crystal panel and an edge type where a light source is arranged on the end face of a light guide plate.

Application Example 1

FIG. 7 shows a structure of a liquid crystal display using a direct-type backlight. In this backlight 40, for example, the above-described light source circuit unit 1 may be arranged on the bottom face of a back chassis 41 (supporting member). On the upper side of the light source circuit unit 1, an optical sheet such as a diffusion sheet 43 is supported by a middle chassis 42. A diffusion sheet 44 is also provided on a sidewall of the back chassis 41.

In this liquid crystal display, light that is extracted from the sealing lens 12 of the light source circuit unit 1 is transmitted through the diffusion sheet 43 to reach a liquid crystal panel 45, and a part of the light is reflected by the diffusion sheets 43 and 44, and further the reflected light thereof is returned back to the diffusion sheet 43 by the white-color resist layer, a reflection sheet, or the like to reach the liquid crystal panel 45, resulting in a display operation being performed.

Application Example 2

In the above-described direct-type backlight, it is difficult to manufacture the large-sized light source circuit unit 1 for a reason of manufacturing a substrate, and thus a substrate may be often subdivided. Each of (A) and (B) of FIG. 8 shows a structure of a backlight 50 using such a divided substrate. (A) of FIG. 8 illustrates a planar structure thereof, and (B) of FIG. 8 illustrates a cross-sectional structure thereof. In this backlight 50, for example, the above-described light source circuit unit 1 may be arranged on the bottom face of aback chassis 51 (supporting member). The plurality of light source circuit units 1 are arranged in side-by-side, and a reflection sheet 58 is provided in common with the plurality of light source circuit units 1. The reflection sheet 58, which may be configured of Al for example, has an opening 51A corresponding to each of the LED chips 13.

On the upper side of the light source circuit unit 1, a diffusion sheet 53 is supported by a middle chassis 52. At the front side of the backlight 50, there is arranged a liquid crystal panel 54. At the back side of the back chassis 51, there is arranged an LED driving circuit substrate 55 for providing a drive current to the light source circuit unit 1. This LED driving circuit substrate 55 is provided with a connector 55A. At one side of the reflection sheet 58, one end of an FFC (Flexible Flat Cable) 57 is joined by thermocompression bonding via an ACF (Anisotropic Conductive Resin) 56. The back chassis 51 is provided with a through-hole 51A in a shape corresponding to an end face shape (rectangular form) of the FFC 57. The FFC 57 is folded back to follow along the back side via the through-hole 51A from the inside of the back chassis 51. An end of the FFC 57 is a connector plug-in port, and this connector plug-in port is plugged into the connector 55A on the LED driving circuit substrate 55 to be electrically connected with one another.

In a liquid crystal display that is provided with such a backlight 50, a divided substrate is used, and thus even in the event that a failure arises in a part of the substrates due to the above-described direct bonding, it is possible to deal with such a failure only by replacing a relevant defective substrate, eliminating the necessity for replacing all the substrates.

Application Example 3

FIG. 9 shows a structure of a liquid crystal display according to an application example 3. In a backlight 60, for example, the above-described light source circuit unit 1 may be arranged on the bottom face of a back chassis 61, and a diffusion sheet 63 is supported by a middle chassis 62 on the upper side of the light source circuit unit 1. At the front side of the backlight 60, there is arranged a liquid crystal panel 64. At the back side of the back chassis 61, there is arranged an LED driving circuit substrate 65. This LED driving circuit substrate 65 is provided with a connector 65A. In the vicinity of an end of the back chassis 61, there is provided a through-hole 61A in a shape corresponding to an end face shape (rectangular form) of the circuit substrate 11 on the light source circuit unit 1. An end side of the circuit substrate 11 is folded back to follow along the back side via the through-hole 61A. An end of the circuit substrate 11 is a connector plug-in port, and this connector plug-in port is plugged into the connector 65A of the LED driving circuit substrate 65 to be electrically connected with one another. It is to be noted that, when a wiring pattern 14 at the circuit substrate 11 side is formed of Al, and terminals at the connector 65A side are plated with gold (Au), a front edge of the connector plug-in port of the circuit substrate 11 may be desirably plated with gold or tin to prevent electrical corrosion due to dissimilar metals.

Typically, electrical connection between an LED circuit substrate and an LED driving circuit substrate has been carried out in such a manner that each substrate is provided with a connector, and these two connectors are joined using a wiring member such as an FFC and a harness. However, in a situation where a unit price of the LED itself has decreased significantly, costs of connector terminals and a wiring member have not been negligible. On the contrary, in the present embodiment, because the circuit substrate 11 of the light source circuit unit 1 has the flexibility, and is foldable as far as the back side of the back chassis 61 as shown in FIG. 9, a connector and a wiring member on the relevant circuit substrate 11 are not necessary, which makes it possible to reduce a component count and costs.

Application Example 4

FIG. 10 also shows a structure of a liquid crystal display using a direct-type backlight. In a backlight 70, for example, the above-described light source circuit unit 1 may be arranged on the bottom face of a back chassis 71, and a diffusion sheet 73 is supported by a middle chassis 72 on the upper side of the light source circuit unit 1. The light source circuit unit 1 is also provided with the above-described reflection sheet 58. At the front side of the backlight 70, there is arranged a liquid crystal panel 74. At the back side of the back chassis 71, there is arranged an LED driving circuit substrate 75 for providing a drive current to the light source circuit unit 1. This LED driving circuit substrate 75 is provided with a connector 75A. Electrical connection between the light source circuit unit 1 and the LED driving circuit substrate 75 is the same as with the application example 3. An area from the back side of the back chassis 71 to a peripheral edge portion at the front side of the liquid crystal panel 74 is covered with a rear cover 76 (back side protective member).

In this backlight 70, the back chassis 71 is curved toward vertical and horizontal end faces thereof, and the light source circuit unit 1 is also curved accordingly. In this light source circuit unit 1, a pitch between the LED chips 13 is also smaller in making an approach toward the vertical and horizontal end faces in accordance with a level of curvature, and a drive current to be provided for the LED chips 13 is also reduced depending on a ratio of mounting density with narrow pitches. Further, the rear cover 76 is also provided with a taper 76A that follows along a curved portion of the back chassis 71.

In other words, this liquid crystal display is so configured as to be seen thinner as a whole by curving the back chassis 71 and the light source circuit unit 1 to achieve thin vertical and horizontal end face side, and providing the taper 76A to the rear cover 76 accordingly. In a liquid crystal display employing such a configuration, when the LED chip 13 on the light source circuit unit 1 is placed toward the end face side, an optical distance between the liquid crystal panel 74 is reduced, and a uniform pitch between the chips would cause particulate unevenness in the LED chip. On the contrary, in this application example 4, a pitch between the LED chips 13 is changed depending on a level of curvature of the light source circuit unit 1, and a drive current to be delivered to the LED chips 13 is also changed depending on the pitch. This makes it possible to perform a control for keeping the plane luminance at the liquid crystal panel 74 at a constant level.

Application Example 5

FIG. 11 shows a structure of a liquid crystal display using an edge-type backlight. In a backlight 80, for example, the above-described light source circuit unit 1 may be arranged on a sidewall of a back chassis 81 (supporting member) in opposition to an end face of a light guide plate 85. On the upper side of the light source circuit unit 1, a diffusion sheet is supported by a middle chassis 82. At the front side of the backlight 80, there is arranged a liquid crystal panel 84.

In this liquid crystal display, an irradiation direction of light that is extracted from the sealing lens 12 of the light source circuit unit 1 is converted into the diffusion sheet side by the light guide plate 85. Thereafter, as with the case of FIG. 7, the light is transmitted through the diffusion sheet to reach the liquid crystal panel 84, and apart of the light is reflected by the diffusion sheet, and further the reflected light thereof is returned back to the diffusion sheet by the white-color resist layer, a reflection sheet, or the like to reach the liquid crystal panel 84, resulting in a display operation being performed.

As the application examples 1 to 5, the direct-type and edge-type backlights are described thus far. By using the light source circuit units 1 or 2 according to the present embodiment as a backlight, any variations in the directivity and chromaticity of light to be extracted from each light source circuit unit 1 are reduced as compared with the light source circuit units 100A and 100B that are described in the above-described comparative examples 1 and 2. In other words, to the same degree as with a currently-available light source circuit unit with a built-in package-type LED, any luminance unevenness and chromaticity unevenness such as particulate unevenness and curtain unevenness are reduced. As a result, it is possible to provide a display with high display performance at lower cost than a display having a light source circuit unit with a built-in package-type LED (more specifically, cost is reduced by 20% to 50%).

The present technology is described thus far with reference to the embodiment and modification example thereof, although the present technology is not limited to the above-described embodiment and the like, but different variations are available. For example, in the above-described embodiment and the like, the description is provided using the LED chip 13 having two electrodes at one side, although as shown in FIG. 12, an LED chip 61 of a type having an n-type electrode 61A and a p-type electrode 61B in opposition to one another at both sides may be used alternatively. In such a case, the pedestal 14C is formed integrally with other wiring layer 14B, and a transparent paste 62 is conductive. In other words, a drive current is provided to the p-type electrode 61B of one side on the LED chip 61 through the wiring layer 14A and the wire 15A, and a drive current is provided to the n-type electrode 61A of the other side through the wiring layer 14B and the pedestal 14C.

It is to be noted that the present technology may be also configured as follows.

(1) A light source circuit unit, including: a circuit substrate having a wiring pattern on a surface thereof, the wiring pattern having light reflectivity; a circular pedestal provided on the circuit substrate; a water-repelling region provided at least from a peripheral edge portion of the pedestal to a part of a side face of the pedestal; and one or two or more light-emitting device chips mounted on the pedestal, and driven by a current that flows through the wiring pattern.

(2) The light source circuit unit according to (1), wherein the pedestal is a part of the wiring pattern, and the water-repelling region is formed of a water-repelling agent.

(3) The light source circuit unit according to (1), wherein the pedestal is formed of a water-repelling agent.

(4) The light source circuit unit according to any one of (1) to (3), wherein the light-emitting device chip is a light-emitting diode.

(5) The light source circuit unit according to any one of (1) to (4), wherein the light-emitting device chip has a pair of electrodes at one side, and the wiring pattern includes the pedestal, and a first wiring pattern and a second wiring pattern to which the respective two electrodes of the light-emitting device chip are electrically connected.

(6) The light source circuit unit according to any one of (1) to (5), wherein the light-emitting device chip has a pair of electrodes at both sides, and the wiring pattern includes a wiring layer serving as the pedestal and to which one of the electrodes of the light-emitting device chip is electrically connected, and another wiring layer to which the other of the electrodes is electrically connected.

(7) The light source circuit unit according to any one of (1) to (6), wherein a part of the wiring pattern is provided with an alignment mark for alignment in mounting the light-emitting device chip on the pedestal and in forming the sealing lens.

(8) An illuminator, including: a supporting member supporting therein a light source circuit unit; and a diffusion sheet arranged in opposition to a whole surface of the light source circuit unit, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

(9) An illuminator, including: a supporting member supporting therein a light guide plate; a diffusion sheet arranged in opposition to a whole surface of the light guide plate; and a light source circuit unit arranged in opposition to an end face of the light guide plate in the supporting member, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

(10) An illuminator, including: a supporting member having a through-hole that passes through from a front side to aback side; an optical sheet supported at the front side of the supporting member; a driving substrate having a connector, and arranged at the backside of the supporting member; and a light source circuit unit that is foldable and arranged between the optical sheet and the supporting member, the light source circuit unit extending up to the back side of the supporting member via the through-hole, and being electrically connected with the driving substrate via the connector, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

(11) An illuminator, including: a supporting member having a through-hole that passes through from a front side to aback side; an optical sheet supported at the front side of the supporting member; a driving substrate having a connector, and arranged at the back side of the supporting member; a plurality of light source circuit units arranged side-by-side between the optical sheet and the supporting member; and a connecting member that is foldable and reaching the back side via the through-hole from inside of the supporting member, the connecting member being electrically connected with each of the light source circuit units via an anisotropic conductive resin, and being electrically connected with the driving substrate via the connector, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

(12) An illuminator, including: an optical sheet; a supporting member having a curved bottom face, the curved bottom face being curved to allow a distance between the curved bottom face and the optical sheet to be reduced as approaching an end face from center; a light source circuit unit that is foldable and having a plurality of light-emitting device chips that are arranged in (one or two or more) columns, the light source circuit unit being housed along the curved bottom face in the supporting member; and a back side protective member covering a whole back side of the supporting member from vicinity of both ends of the optical sheet, and having an inclined surface that follows along the curved bottom face of the supporting member, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

(13) The illuminator according to (12), wherein an arrangement pitch in a column direction of the plurality of light-emitting device chips becomes narrower as a width of the housing space becomes narrower.

(14) The illuminator according to (13), wherein a drive current to be applied to the plurality of light-emitting device chips for uniform plane luminance is adjusted depending on the arrangement pitch in the column direction of the light-emitting device chips.

(15) A display, including: a display panel; and alight source circuit unit as a light source for the display panel, the light source circuit unit including a circuit substrate having a wiring pattern on a surface thereof, the wiring pattern having light reflectivity, a circular pedestal provided on the circuit substrate, a water-repelling region provided at least from a peripheral edge portion of the pedestal to a part of a side face of the pedestal, and one or two or more light-emitting device chips mounted on the pedestal, and driven by a current that flows through the wiring pattern.

The invention claimed is:

1. A backlight assembly comprises:
    at least one circuit substrate having a wiring pattern on a surface thereof, the wiring pattern having light reflectivity;
    at least one pedestal mounted on the wiring pattern; and
    at least one light emitting diode chip mounted on the at least one pedestal,
    wherein the at least one pedestal is formed integrally with the wiring pattern, in which a conductive paste is between the at least one light emitting diode chip and the at least one pedestal.

2. The backlight assembly of claim 1, wherein the conductive paste is transparent.

3. The backlight assembly of claim 1, wherein the at least one circuit substrate includes a connector plug-in port.

4. The backlight assembly of claim 1, wherein the at least one pedestal is formed of conductive material.

5. The backlight assembly of claim 1, further comprising:
    a fluorescent material on the at least one light-emitting element chip.

6. The backlight assembly of claim 1, wherein the at least one pedestal comprises a water-repelling agent around a periphery of the each pedestal.

7. The backlight assembly of claim 1, further comprising:
    a water-repelling region provided at least from a peripheral edge portion of the at least one pedestal.

8. A light source circuit unit, comprising:
    a circuit substrate that has a light-reflective wiring pattern on a surface thereof;
    a pedestal formed of a water-repellant agent and having a lens thereon, wherein the pedestal has a shape that determines the shape and position of the lens;
    one or two or more light-emitting device chips mounted on the pedestal for being driven by a current through the wiring pattern; and
    a reflective sheet having one or more openings corresponding to each of the one or more light-emitting device chips over the circuit substrate.

9. The light source circuit unit according to claim 8, wherein the pedestal is a part of the wiring pattern, and a water-repelling region is formed of the water-repelling agent.

10. The light source circuit unit according to claim 8, wherein the pedestal is provided with a water-repelling region.

11. The light source circuit unit according to claim 8, wherein a first light-emitting device chip of the one or two or more light-emitting device chips is a light-emitting diode.

12. The light source circuit unit according to claim 8,
    wherein a first light-emitting device chip of the one or two or more light-emitting device chips has a pair of electrodes at one side, and
    wherein the wiring pattern includes the pedestal, and a first wiring pattern and a second wiring pattern to which the respective two electrodes of the first light-emitting device chip are electrically connected.

13. The light source circuit unit according to claim 8,
    wherein a first light-emitting device chip of the one or two or more light-emitting device chips has a pair of electrodes at both sides, and
    wherein the wiring pattern includes a wiring layer serving as the pedestal and to which one of the electrodes of the first light-emitting device chip is electrically connected, and another wiring layer to which the other of the electrodes is electrically connected.

14. The light source circuit unit according to claim 8, wherein a part of the wiring pattern is provided with an alignment mark for alignment in mounting the one or two or more light-emitting device chips on the pedestal and in forming the lens, wherein the lens is a sealing lens.

15. A display comprising:
    a plurality of circuit substrates that each has a light-reflective wiring pattern on a surface thereof;
    one or more light-emitting element chips mounted on a pedestal on each of the circuit substrates, the pedestal formed of a water-repellant agent, the one or more light-emitting element chips for being driven by a current through the light-reflective wiring pattern, wherein the pedestal is formed integrally with the wiring pattern; and a reflective sheet having an opening corresponding to the one or more light-emitting element chips and being over an entire area above the circuit substrate.

16. The display of claim 15, further comprising a lens on each of the pedestals.

17. The display to claim 15, wherein a plurality of light source circuit substrates is arranged side-by-side between an optical sheet and a supporting member.

18. The display to claim 17, wherein a plurality of light source circuit substrates is arranged side-by-side between an optical sheet and a supporting member.

19. The display of claim 15, wherein the pedestals are made of a thermally conductive material and the pedestals transfer heat from the one or more light-emitting element chips.

20. The display of claim 15, wherein a water-repelling region is formed from a peripheral edge portion of the pedestals to a part of a side face of the pedestals.

\* \* \* \* \*